United States Patent [19]

Sakamoto et al.

[11] Patent Number: 5,547,558
[45] Date of Patent: Aug. 20, 1996

[54] PROCESS FOR ELECTROPLATING NONCONDUCTIVE SURFACE

[75] Inventors: Yoshihiro Sakamoto; Toshio Tanimura, both of Amagasaki, Japan

[73] Assignee: MEC Co., Ltd., Amagasaki, Japan

[21] Appl. No.: 404,454

[22] Filed: Mar. 15, 1995

[30] Foreign Application Priority Data

Mar. 28, 1994  [JP]  Japan .................. 6-057314

[51] Int. Cl.$^6$ ............... C25D 5/02; C25D 5/54; C25D 5/56; C23C 28/00
[52] U.S. Cl. ............ 205/125; 205/159; 205/162; 205/163; 205/164; 205/165; 205/166; 205/183; 205/188
[58] Field of Search ................ 205/125, 159, 205/162, 163, 164, 165, 166, 183, 188

[56] References Cited

U.S. PATENT DOCUMENTS

| | | | |
|---|---|---|---|
| 4,035,265 | 7/1977 | Saunders | 252/510 |
| 5,015,339 | 5/1991 | Pendleton | 204/15 |
| 5,389,270 | 2/1995 | Thorn et al. | 252/22 |

FOREIGN PATENT DOCUMENTS

| | | |
|---|---|---|
| 2274853 | 8/1994 | United Kingdom . |
| WO94/26958 | 11/1994 | WIPO . |

Primary Examiner—Bruce F. Bell
Assistant Examiner—Edna Wong
Attorney, Agent, or Firm—Oblon, Spivak, McClelland, Maier, & Neustadt, P.C.

[57] ABSTRACT

The invention relates to a process for directly electroplating a conductive metal to the inner walls of through-holes in printed-wiring boards. The process comprises steps of providing an aqueous dispersion containing graphite particles with an average particle diameter of 2 μm or less or carbon black particles with an average particle diameter of 1 μm or less; applying this aqueous dispersion to a surface of a nonconductive surface substrate; dipping the nonconductive surface in a strong acidic aqueous solution with pH 3 or lower to form a layer of said particles; and electroplating using the particle layer as a conductive layer.

1 Claim, No Drawings

PROCESS FOR ELECTROPLATING NONCONDUCTIVE SURFACE

BACKGROUND OF THE INVENTION

1. Field of the Invention

The present invention relates to a process for electroplating a nonconductive surface, and, more particularly, to a process for electroplating a conductive metal on the inner walls of through-holes in printed-wiring boards.

2. Description of the Background Art

In printed-wiring boards such as double-sided boards and multilayer boards, through-holes are provided in the substrate. The inner walls of the through-holes are electroplated with a conductive metal in order to secure conductivity among the circuits.

As a method of electroplating the nonconductive inner walls of through-holes, Shortt et al. disclose a method of electroplating after providing the through-hole inner walls with electro-conductivity by the application of particles of silver, copper, graphite or the like (U.S. Pat. No. 3,163,588). In this method, however, defects such as pinholes are created in the plated layer of the through-hole inner wall, when excessive plated portions are removed. This inner wall must be re-electroplated, which not only makes the process complicated, but also it cannot be applied at all to the manufacture of reliable high density printed-wiring boards currently required.

In U.S. Pat. No. 3,099,608 Radovsky et al. indicate that a drawback in the case where graphite is used as a conductive layer for electroplating is in the poor deposition of metals to be electroplated.

At the present time, electroless copper plating is applied as the method for plating metal on the through-hole inner walls. However, the electroless copper plating has the following drawbacks: (1) it requires a comparatively long period of time, (2) a number of baths must be monitored all the time during the plating process (required components must be supplied to each bath and sufficient care must be taken so that the baths are not contaminated with components used in the preceding steps, because the baths are extremely sensitive to contamination), (3) a number of washing baths are needed and these baths consume a great quantity of water for washing, and (4) waste water disposal is expensive.

As a method for electroplating without using the electroless copper plating which has these drawbacks, Randolph et al. proposed a method of electroplating after forming a carbon black layer by applying a dispersion of carbon black having an average diameter of less than about 3 μm and a surfactant to the through-hole inner wall, and further forming on this carbon black layer a graphite layer by applying a dispersion of graphite having an average diameter of less than about 1.5 μm and a surfactant (U.S. Pat. No. 5,139,642). This method requires formation of two layers, a carbon black layer and a graphite layer, as base layers for electroplating, resulting in complicated processes and increase in the cost.

As an improvement over U.S. Pat. No. 5,139,642, a process was disclosed in GB 2,274,853. This process was successful in increasing reliability and reducing the cost in electroplating nonconductive surfaces to some extent by forming a layer of graphite using an aqueous dispersion of graphite particles and a binder.

The present inventors have undertaken extensive studies in order to develop a more efficient and reliable method for electroplating a conductive metal on a nonconductive surface, especially on the through-hole inner wall of printed-wiring board, and found that electroplating a conductive metal on a layer of carbon particles, such as graphite particles, produced by application of such particles to the through-hole inner walls and dipping in a strongly acidic aqueous solution provides superb electroplated surfaces without defects such as voids.

SUMMARY OF THE INVENTION

Accordingly, an object of the present invention is to provide a process for electroplating a nonconductive surface comprising:

(a) providing an aqueous dispersion containing graphite particles with an average particle diameter of 2 μm or less or carbon black particles with an average particle diameter of 1 μm or less, or both (hereinafter referred to as "specific carbon particles"), (b) applying this aqueous dispersion of specific carbon particles to a nonconductive surface to attach the specific carbon particles, (c) dipping the nonconductive surface in a strong acidic aqueous solution with pH 3 or lower, and (d) electroplating using the specific carbon particle layer as a conductive layer.

Another object of the present invention is to provide a process for electroplating a through-hole inner wall of a printed-wiring board, comprising:

(a) providing an aqueous dispersion of the specific carbon particles, (b) applying this aqueous dispersion of specific carbon particles to the surface of said printed-wiring board through which through-holes have been provided to attach the specific carbon particles, (c) dipping said printed-wiring board in a strong acidic aqueous solution with pH 3 or lower, (d) removing the specific carbon particle layer attached to the surface of the conductive metal layers by etching these metal layers for a thickness of 0.01 to 5.0 μm, and (e) electroplating using the conductive metal layer and the specific carbon particle layer as a conductive layer.

These and other objects, features, and advantages of the present invention will become more apparent from the following description of the preferred embodiments.

DETAILED DESCRIPTION OF THE INVENTION AND PREFERRED EMBODIMENTS

In the process of the present invention, the aqueous dispersion of specific carbon particles is first applied to the nonconductive surface to attach the specific carbon particles.

The graphite particles in the specific carbon particles are super fine particles with an average diameter of 2 μm or less, preferably 1 μm or less, and more preferably 0.7 μm or less. If the average diameter is greater than 2 μm, not only the conductivity is lowered, but also the attachability of a conductive metal to be electroplated to the nonconductive surface is poor. As the carbon black particles, super fine particles with an average diameter of 1 μm or less, preferably 0.5 μm or less, and more preferably 0.3 μm or less, are used. If the average diameter is greater than 1 μm, voids, i.e. portions where the metal is not deposited after the electroplating, may increase, thereby decreasing the reliability of the electroplating. Any specific carbon particles having a particle size not exceeding these upper-side limits can be used, with no specific limitations to the lower-side limits. The graphite particles and the carbon black particles can be used either independently or in combination.

The amount of the specific carbon particles in the aqueous dispersion is less than 10% by weight (% by weight is hereinafter simply referred to as %), and preferably 1% to 5%. If this amount is greater than 10%, the attachability of a conductive metal to be electroplated to the nonconductive surface is poor; if less than 1%, the density of the graphite particles or the carbon black particles in the formed layer is too small for this layer to be sufficiently conductive.

Various components other than the specific carbon particles may be optionally incorporated in the aqueous dispersion of these particles. Such components include binders for increasing the attachability of the specific carbon particles to the nonconductive surfaces, surfactants for promoting the attachability of the specific carbon particles and stability of the dispersion, a water-soluble polymers for increasing the stability of the dispersion, and the like.

Either organic or inorganic binders can be used as the binder, with the inorganic binders, such as sodium silicate and potassium silicate, being more preferred. The amount of binder contained in the aqueous dispersion is usually in the range of 0.05 to 5%. If the amount of the binder is too large, the conductivity and film-forming capability are decreased. As the surfactants, anionic surfactants, such as carboxylic acid-type surfactants, polycarboxylic acid-type surfactants, naphthalene sulfonic acid-type surfactants and neutral phosphorate-type surfactants, can be used. Nonionic surfactants and cationic surfactants may be also used depending on the conditions of dispersion. The water-soluble polymer which can be added to the aqueous dispersion includes, for example, carboxymethyl cellulose, starch and gum arabic. Furthermore, the aqueous dispersion of the specific carbon particles is preferably adjusted to about pH 9–13 by the addition of aqueous ammonia, sodium hydroxide, potassium hydroxide or the like, preferably ammonia.

The aqueous dispersion of graphite particles can be prepared by the wet process comprising pulverization, dispersion, and classification. This method is preferable for improving dispersion stability and narrowing the size distribution of the graphite particles. In the case of carbon black particles, no pulverization treatment is needed for preparing the aqueous dispersion.

In order to apply the aqueous dispersion of specific carbon particles to a nonconductive surface, spraying, dipping or coating can be employed with no specific limitations.

Then, the nonconductive surface is dipped in a strong acidic aqueous solution with pH 3 or lower in order to flocculate the specific carbon particles attached to the surface thereof. This treatment makes the layer of the specific carbon particles denser and decreases the electric resistance, thereby promoting platability of metals.

As the strong acidic aqueous solution, an aqueous solution of sulfuric acid, hydrochloric acid, nitric acid or the like with pH 3 or lower, preferably pH 0.1–1, can be used. If the pH is higher than 3, the graphite particles or carbon black particles are dispersed in this acidic aqueous solution, making it difficult for these particles to be attached to nonconductive surfaces. There are no specific limitations as to the lower-side limit of the pH. Any aqueous solution with a pH not exceeding 3 can be used.

A conductive metal is then electroplated using the layer of the specific carbon particles as a conductive layer.

There are no specific limitations as to the method of electroplating. For example, the electroplating can be carried out at a normal temperature and at 1.5 to 3 $A/dm^2$ for 60 to 90 minutes in a common electroplating bath. There are also no specific limitations to the conductive metal used for the electroplating. Copper and nickel are given as examples.

The process of the present invention can be applied to electroplating of various nonconductive materials. It is particularly useful for electroplating through-hole inner walls of printed-wiring boards made of, for example, paper-based phenol resin copper laminated boards, glass-based epoxy resin copper laminated boards, composite copper laminated boards, polyimide copper laminated boards, fluorine-containing resin copper laminated boards, and copper laminated boards for flexible circuits. Since attachability using the electroplating method of the present invention is extremely excellent, it can produce evenly attached and highly reliable electroplating on even internal walls of through-holes, called viaholes, which are holes with a diameter of 0.3 to 0.5 mm.

Typical steps adopted for applying electroplating using the process of the present invention to through-hole internal walls of a printed-wiring board are now illustrated taking the case where electroplating is performed on through-hole internal walls of a substrate with copper foils laminated over the both sides thereof (a glass-based epoxy resin copper laminated board).

(1) Washing of substrate surface

This is a treatment to clean the through-hole inner walls, and comprises washing the board with a weak alkaline solution of about pH 9–12 containing an anionic surfactant such as a phosphoric acid ester at 35°–65° C. for about 20 to 60 seconds and rinsing with water.

(2) Conditioning treatment

This is a treatment to accelerate attachment of the specific carbon particles to the cleaned surface of through-hole inner walls, and normally comprises the treatment with a weak alkaline solution of about pH 9–12 containing a cationic surfactant of polyamine-type, polyamide-type or the like at 20°–60° C. for about 20 to 60 seconds, and rinsing with water.

(3) Application of the specific carbon particles

The board is dipped in the aqueous dispersion containing the specific carbon particles, normally, at 20°–60° C. for about 30 to 90 seconds.

(4) Acid treatment

The board is dipped in the strong acidic aqueous solution with pH 3 or lower, normally, at 20°–60° C. for about 30 to 100 seconds, and then blown with air at 60°–90° C. for about 30 to 90 seconds to remove water.

(5) Microetching

This is a step for removing the layer of the specific carbon particles on the copper surface. Among the specific carbon particle layers attached to the surface of the copper foil and those attached to the copper (copper foil cross-section) and the non-conductive surface (glass fiber, epoxy resin) which are exposed in the through-hole inner walls, the former decreases attachability of the conductive metal to be electroplated to the copper surface and impairs the conductivity between the copper surface and the conductive metal. For this reason, the specific carbon particle layer on the copper surface must be removed. In this treatment, the specific carbon particles are removed by etching the copper surface beneath the specific carbon particle layer without effecting any direct action on the specific carbon particles itself. This treatment can be carried out, for example, by dipping the substrate in an etching solution of the sulfuric acid-hydrogen peroxide type at a temperature of 20°–30° C. to etch to an approximate thickness of 0.01–5.0 μm, preferably 0.1–3.0 μm, and more preferably 0.1–1.2 μm, followed by washing and drying. If the depth of etching is less than 0.01 μm, the specific carbon particles remain on the copper surface; if overetched in excess of 5.0 μm, the conductivity between the copper and the specific carbon particle layer on the nonconductive surface is lost and electroplate voids tend to be produced.

(6) Electroplating

Electroplating can be carried out under conditions of normal temperature and at 1.5 to 3 A/dm$^2$ for 60–90 minutes in a common electroplating bath.

It is possible to combine said step (1) (washing of substrate surface) and step (2) (conditioning treatment). In this instance, the board may be treated with a weak alkaline solution of about pH 9–12 containing a cationic surfactant of polyamine-type, polyamide-type or the like and a solvent such as ethanolamine at 20°–60° C. for about 20 to 60 seconds, and rinsed with water.

Other features of the invention will become apparent in the course of the following description of the exemplary embodiments which are given for illustration of the invention and are not intended to be limiting thereof.

EXAMPLES

Example 1

A substrate (10 cm×25 cm×1.6 mm) consisting of an insulating layer of glass fiber impregnated with epoxy resin and copper foils with a thickness of 35 μm laminated on both sides of the insulating layer, provided with about 960 through-holes with a diameter of 0.3 to 0.8 mm, was processed as follows.

The substrate was dipped in a solution consisting of 0.5% of an cationic surfactant, 1.0% of amine and a balance amount of water (a cleaner conditioner) at 45° C. for 40 seconds, followed by washing with water (washing and conditioning). The substrate was then dipped in a graphite dispersion consisting of 4.0% of graphite particles having an average particle diameter of 0.4 μm, 0.5% of carboxymethyl cellulose, 0.5% of sodium silicate, 1% of a cationic surfactant and a balance amount of water, adjusted to pH 10 with ammonia, at 25° C. for 60 seconds. It was then dipped in a 10% sulfuric acid aqueous solution with a pH of 0.2 at 20° C. for 30 seconds, followed by drying at 90° C. for 100 seconds (acid treatment). To perform microetching, this substrate was dipped in a liquid comprising sulfuric acid and hydrogen peroxide (CA-90: trademark, a product of MEC Co.) at 25° C. for 20 seconds, followed by washing with water and drying. Copper was removed to a thickness of 1 μm by this microetching treatment.

Next, electroplating was performed on the substrate at 2 A/dm$^2$ for 90 minutes at 25° C. using a conventional copper plating bath.

As a result of a backlight test, it was found that a uniform copper electroplated layer was provided on the walls of the through-holes and there were no voids in any through-holes, even in those having a small diameter of 0.3 to 0.5 mm, not to mention those having a comparatively large a diameter of 0.6 to 0.8. Further, the adhesion was evaluated by the flow solder test (conforming to JIS C 5012, except that solder at a temperature of 260°–265° C. was used instead of oil and the test was carried out at 10 cycles) to confirm that there was no electroplated copper released from the through-hole walls.

Example 2

The same substrate as used in Example 1 was treated and electroplated in the same manner as in Example 1, except that the content of graphite particles in the graphite aqueous dispersion was 3.0%.

The electroplated substrate was evaluated in the same manner as in Example 1 to confirm that the substrate was excellently electroplated with a uniform thickness copper layer with no voids in any through-holes, including those having a small diameter of 0.3 to 0.5 mm. Also, no release of electroplated copper from the walls of the through-holes was found as a result of the adhesion test.

Example 3

A substrate was treated and electroplated in the same manner as in Example 1, except that a graphite dispersion consisting of 3% of graphite particles having an average particle diameter of 0.4 μm, 0.5% of potassium silicate, 1% of a cationic surfactant and a balance amount of water, and adjusted to pH 10 with ammonia, was used.

The electroplated substrate was evaluated in the same manner as in Example 1 to confirm that the substrate was excellently electroplated with a uniform thickness copper layer with no voids in any through-holes, including those having a small diameter of 0.3 to 0.5 mm. Also, no release of electroplated copper from walls of through-holes was found as a result of the adhesion test.

Example 4

A substrate was treated and electroplated in the same manner as in Example 1, except that a graphite dispersion containing 4.5% of graphite particles having an average particle diameter of 0.5 μm was used.

The electroplated substrate was evaluated in the same manner as in Example 1 to confirm that the substrate was excellently electroplated with a uniform thickness copper layer with no voids in any through-holes, including those having a small diameter of 0.3 to 0.5 mm. Also, no release of electroplated copper from the walls of the through-holes was found as a result of the adhesion test.

Example 5

A substrate was treated and electroplated in the same manner as in Example 1, except that instead of the aqueous dispersion of graphite a carbon black dispersion consisting of 3.0% of carbon black particles having an average particle diameter of 0.1 μm, 1% of a cationic surfactant and a balance amount of water, and adjusted to pH 10 with potassium hydroxide, was used.

The electroplated substrate was evaluated in the same manner as in Example 1 to confirm that the substrate was excellently electroplated with a uniform thickness copper layer with no voids in any through-holes, including those having a small diameter of 0.3 to 0.5 mm. Also, no release of electroplated copper from walls of through-holes was found as a result of the adhesion test.

Comparative Example 1

A substrate was treated and electroplated in the same manner as in Example 1, except that a graphite dispersion containing 3.0% of graphite particles having an average particle diameter of 3 μm was used.

The electroplated substrate was evaluated in same manner as in Example 1. Voids were found in about 70% of the through-holes having a diameter of 0.6 to 0.8 mm and in almost all through-holes having a diameter of 0.3 to 0.5 mm. The adhesion test was carried out on through-holes having a diameter of 0.8 mm or larger. Copper electroplated inside the holes was peeled off, revealing that the product was unacceptable.

Comparative Example 2

A substrate was treated and electroplated in the same manner as in Example 1, except that a graphite dispersion containing 4.5% of graphite particles having an average particle diameter of 3 μm was used.

The electroplated substrate was evaluated in same manner as in Example 1. Voids were found in about 50% of through-holes having a diameter of 0.6 to 0.8 mm and in almost all through-holes having a diameter of 0.3 to 0.5 mm. The adhesion test was carried out on through-holes having a diameter of 0.8 mm or larger. Copper electroplated inside the holes was peeled off, revealing that the product was unacceptable.

These results shows that according to the process of the present invention copper can be excellently electroplated with strong adhesion to the through-hole walls as compared with the case where a graphite aqueous dispersion containing graphite particles having an average diameter of larger than 2 μm is used.

Comparative Example 3

The same substrate as used in Example 1 was dipped in an aqueous solution containing 0.5% of a cationic surfactant and 1.0% of amine (a cleaner conditioner) at 45° C. for 40 seconds, and washed with water (washing-conditioning). The substrate was then dipped in a graphite dispersion consisting of 1.5% of graphite particles having an average particle diameter of 0.4 μm, 0.5% of carboxymethyl cellulose, 0.5% of sodium silicate, 1.0% of an anionic surfactant and a balance amount of water, adjusted to pH 10 with ammonia, at 25° C. for 60 seconds. The substrate was blown with air at a temperature of 40° C. for 45 seconds to remove the dispersion media, and then dipped in a liquid comprising sulfuric acid and hydrogen peroxide (CA-90: trademark, a product of MEC Co.) at 25° C. for 20 seconds, followed by washing with water and drying (microetching). Copper was removed to a thickness of 1 μm by this microetching treatment.

The electroplated substrate was evaluated in same manner as in Example 1. Voids were found in about 20% of through-holes having a diameter of 0.6 to 0.8 mm and in about 5% of through-holes having a diameter of 0.3 to 0.5 mm.

Comparative Example 4

A substrate was treated and electroplated in the same manner as in Example 1, except that a carbon black dispersion containing 3.0% of carbon black particles having an average particle diameter of 2 μm was used.

The electroplated substrate was evaluated in same manner as in Example 1. Voids were found in about 90% of through-holes having a diameter of 0.6 to 0.8 mm and in almost all through-holes having a diameter of 0.3 to 0.5 m.

These results shows that according to the process of the present invention copper can be excellently electroplated with strong adhesion to the through-hole walls as compared with the case where a graphite aqueous dispersion containing graphite particles having an average diameter of larger than 2 μm is used.

These results shows that according to the process of the present invention copper can be excellently electroplated with strong adhesion to the through-hole walls as compared with the case where a graphite aqueous dispersion containing graphite particles having an average diameter of larger than 2 μm is used.

As illustrated above, the process of the present invention ensures reliable electroplating on nonconductive surfaces at a low cost. This process is highly reliable and can be applied with advantage especially to multi-layered, small diameter printed-wiring boards.

Obviously, numerous modifications and variations of the present invention are possible in light of the above teachings. It is therefore to be understood that within the scope of the appended claims, the invention may be practiced otherwise than as specifically described herein.

We claim:

1. A process for electroplating a through-hole inner wall of a printed-wiring board having a conductive metal layer, comprising:

(a) providing an aqueous dispersion of specific carbon particles containing (1) graphite particles with an average particle diameter of 2 μm or less or carbon black particles with an average diameter of 1 μm or less, or both and (2) 0.05 to 5% of an inorganic binder, (b) applying said aqueous dispersion of specific carbon particles to a surface of said printed-wiring board in which through-holes have been provided, to deposit a layer of specific carbon particles in said through-holes, (c) dipping said printed-wiring board in a strong acidic aqueous solution having a pH of 3 or lower, (d) removing a specific carbon particle layer attached to the surface of said conductive metal layer by etching the metal layer to remove a thickness of 0.01 to 5.0 μm, and (e) electroplating using the conductive metal layer and the specific carbon particle layer as a conductive layer.

\* \* \* \* \*

UNITED STATES PATENT AND TRADEMARK OFFICE
CERTIFICATE OF CORRECTION

PATENT NO. : 5,547,558
DATED : AUGUST 20, 1996
INVENTOR(S) : YOSHIHIRO SAKAMOTO ET AL

It is certified that error appears in the above-identified patent and that said Letters Patent is hereby corrected as shown below:

Column 8, line 36, in claim 1, after "binder," insert --selected from the group consisting of sodium silicate and potassium silicate--.

Signed and Sealed this

Ninth Day of June, 1998

*Attest:*

BRUCE LEHMAN

*Attesting Officer*  *Commissioner of Patents and Trademarks*